United States Patent
Chao

[19]

[11] Patent Number: 6,094,624
[45] Date of Patent: *Jul. 25, 2000

[54] ELECTRONIC TEST FACILITY

[76] Inventor: Nathan Chao, P.O. Box 3016, Teaneck, N.J. 07666

[*] Notice: This patent issued on a continued prosecution application filed under 37 CFR 1.53(d), and is subject to the twenty year patent term provisions of 35 U.S.C. 154(a)(2).

[21] Appl. No.: 08/914,413

[22] Filed: Aug. 19, 1997

Related U.S. Application Data

[63] Continuation of application No. 08/914,413, Aug. 19, 1997.

[51] Int. Cl.$^7$ .................................................. G01R 1/00
[52] U.S. Cl. .................................... 702/117; 324/500
[58] Field of Search .............................. 702/117, 108, 702/120; 371/22.1, 22.2, 20.1; 324/500, 527

[56] References Cited

U.S. PATENT DOCUMENTS

| | | | |
|---|---|---|---|
| 4,072,851 | 2/1978 | Rose | 364/487 |
| 4,238,784 | 12/1980 | Keen et al. | 340/347 |
| 4,571,689 | 2/1986 | Hildebrand et al. | 364/481 |
| 4,747,060 | 5/1988 | Sears, III et al. | 364/481 |
| 4,758,779 | 7/1988 | Thong | 324/72.5 |
| 4,862,067 | 8/1989 | Brune et al. | 324/73 R |
| 5,003,486 | 3/1991 | Hendel et al. | 364/483 |
| 5,014,226 | 5/1991 | Horstmann et al. | 364/551.01 |
| 5,254,992 | 10/1993 | Keen et al. | 341/119 |
| 5,307,290 | 4/1994 | Raviglione et al. | 364/551.01 |
| 5,345,392 | 9/1994 | Mito et al. | 364/483 |
| 5,396,168 | 3/1995 | Heep et al. | 324/115 |
| 5,406,495 | 4/1995 | Hill | 364/483 |
| 5,459,671 | 10/1995 | Duley | 364/483 |
| 5,526,287 | 6/1996 | French | 364/550 |
| 5,764,952 | 6/1998 | Hill | 395/500 |
| 5,790,839 | 8/1998 | Luk et al. | 395/556 |
| 5,852,737 | 12/1998 | Bikowsky | 395/750.05 |

OTHER PUBLICATIONS

Knorr, Eric, "The PC Bible," (Berkeley, CA: Peachpit Press, 1995), Chpt 8, pp 142–143, Dec. 1995.

*Primary Examiner*—Timothy P. Callahan
*Assistant Examiner*—Linh Nguyen
*Attorney, Agent, or Firm*—Robert Moll

[57] ABSTRACT

A circuit board arrangement for testing a test circuit. The circuit arrangement includes a single circuit board, a data acquisition device and a power supply device. The data acquisition device and the power supply device are disposed on the single circuit board. The single circuit board is coupled to the test circuit so that the data acquisition device can receive test output signals from the test circuit. The power supply provides power to the test circuit.

16 Claims, 6 Drawing Sheets

ELECTRONIC TEST FACILITY

This application is a continuation of U.S. application Ser. No. 08/914,413, filed on Aug. 19, 1997, which is incorporated herein by reference.

FIELD OF THE INVENTION

The present invention relates to a circuit board arrangement, and in particular the circuit board arrangement disposing at least a data acquisition device and a power supply thereon.

BACKGROUND INFORMATION

A conventional electronics test facility includes three basic instruments—a data acquisition device (e.g., oscilloscopes, multimeters, etc.), a signal generator and a power supply. The signal generator provides test signals to test circuits so that output signals may be generated by the test circuits, in which the data acquisition device measures the output signals from the test circuits, and the power supply supplies power to the test circuits.

It is known to situate a conventional data acquisition device on a single circuit board which can be positioned in a dedicated box to be connected to a personal computer or can be positioned directly in a communication slot of the personal computer. However, the data acquisition devices and power supplies were previously not placed on a single circuit board (along with other desired components).

U.S. Pat. No. 5,526,287 describes a portable data collection device capable of sensing voltage, resistance and current data in a digital form or in an analog form. The data collection device includes a housing, a processor for controlling input and output information corresponding to the sensed information, a storage device storing the information, a serial port and an internal power source. There is no indication in this publication, however, that this portable data collection device is disposed on a single circuit board along with a power source.

One of the objects of the present invention is to provide presently available components economically on a single circuit board so that test circuits can be easily tested using a standalone device connected between a digital computer and the test circuit, or by connecting this arrangement between an internal connection slot of the digital computer and the test circuit.

SUMMARY OF THE INVENTION

A circuit arrangement according to the present invention includes a single circuit board, a data acquisition device and a power supply device. The data acquisition device and the power supply device are each disposed on the single circuit board. The circuit board arrangement is connected to a test circuit so that the data acquisition device can receive test output signals from the test circuit. The power supply provides power to the test circuit. Thus, the test output signals from the test circuit can be analyzed by, e.g., a digital computer. A signal generating device may also be provided on the single circuit to stimulate a generation of the test output signal from the test circuit.

DETAILED DESCRIPTION OF THE INVENTION

Figure 1:
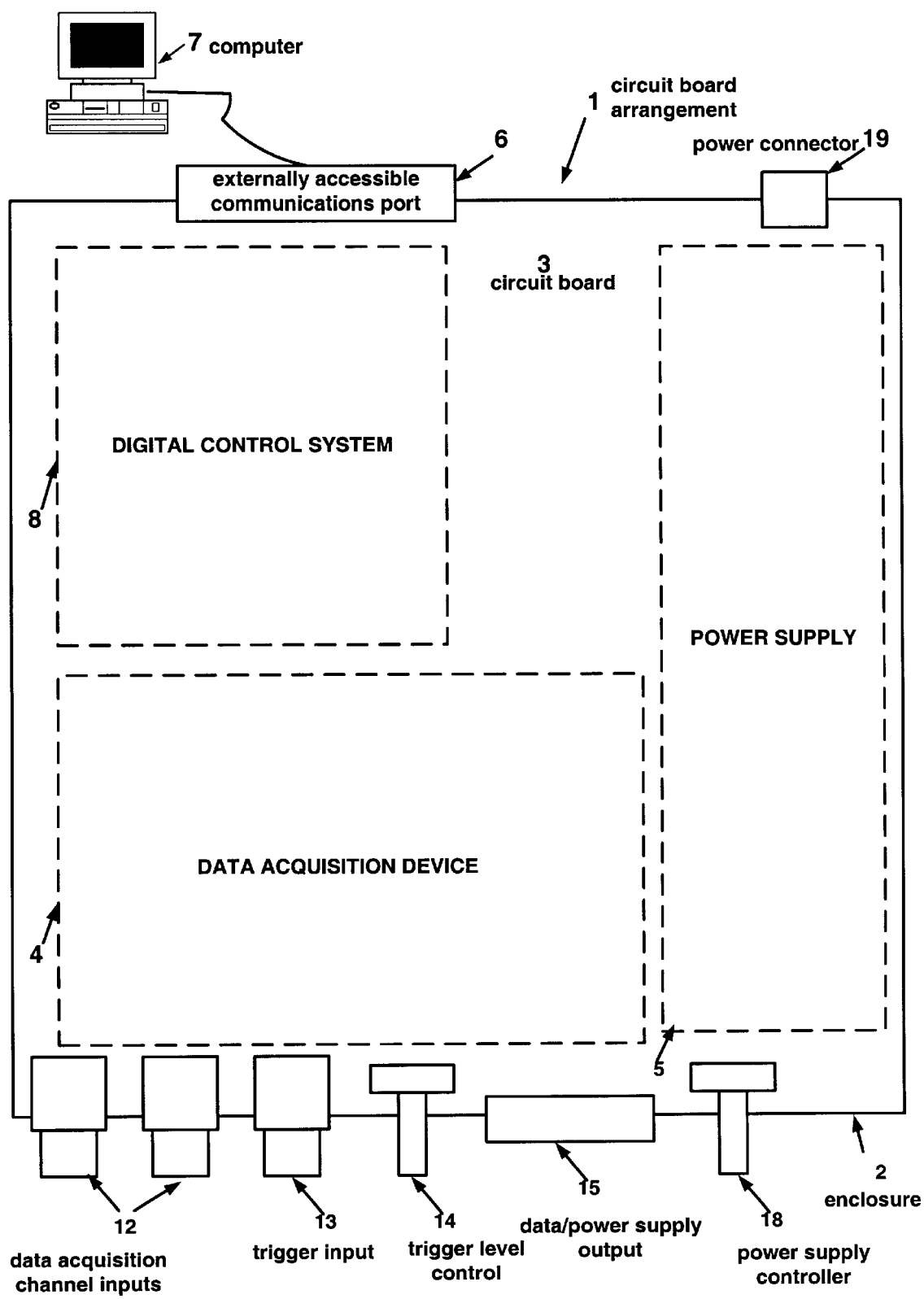
FIG. 1 shows a cross-section of a top view of a first embodiment of a single circuit board arrangement according to the present invention.
Figure 2:
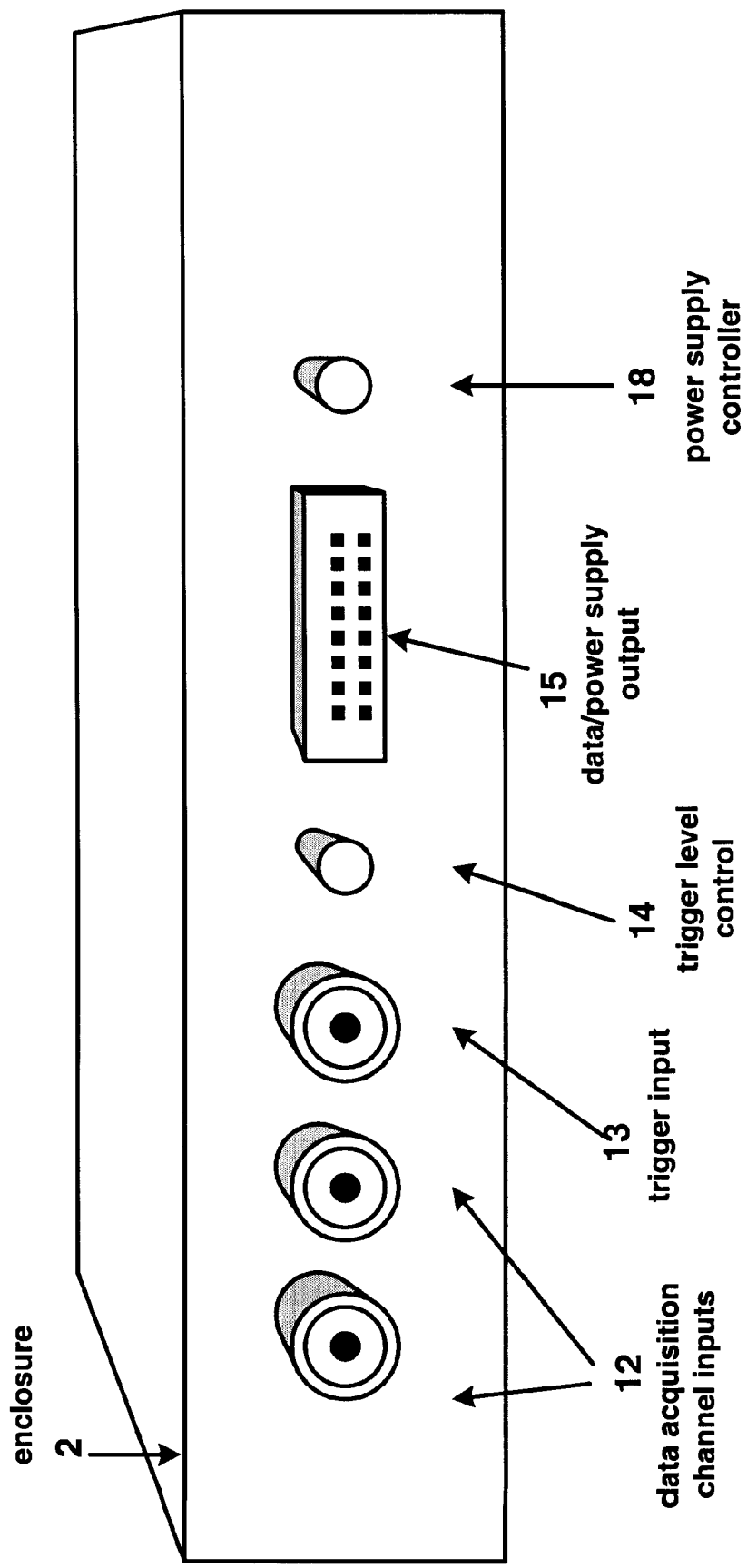
FIG. 2 shows a front view of a housing for the first embodiment of the single circuit board arrangement according to the present invention.

FIGS. 1 and 2 show a first embodiment of a circuit board arrangement 1 including a single circuit board 3, a data acquisition device 4 (e.g., a multichannel data acquisition device) and a power supply 5 (e.g, a flexible multiple voltage user power supply). The data acquisition device 4 and the power supply 5 are disposed on the single circuit board 3. FIGS. 1 and 2 also show the circuit board arrangement 1 situated in a dedicated housing 2. The data acquisition device 4 and the power supply 5 may, for example, be provided directly on the circuit board 3 or upon a number of daughter boards (e.g., not exceeding three daughter boards) mounted on the single circuit board 3. The daughter boards (not shown) may also be provided on the single circuit board 3. If the daughter boards are utilized, these daughter boards should preferably not exceed a surface area of, for example, approximately six square inches.

The circuit board arrangement 1 further includes an externally accessible communications port 6 (which may be connected to a serial port, a parallel port, or a USB port of a digital computer 7, as are known in the art) for operably coupling the arrangement 1 to the digital computer 7 (e.g., a general purpose computer, dedicated computer, or the like). The communications port 6 is connected to the data acquisition device 4 and the power supply 5 either directly or via a digital control system 8 (e.g., a microprocessor) using, for example, a communications bus or hard-wired connections. The digital control system 8 (which may include discrete circuit elements or an integrated circuit) can be situated on the single circuit board 3 or on the daughter boards. The digital control system 8 may be either a separate circuit element, or may be embedded into the data acquisition device 4 or into the power supply 5.

Conventional data acquisition devices (e.g., oscilloscopes, frequency meters, voltmeters, current meters, digital multimeters, etc.) are well known in the art. The data acquisition device 4 provided on the single circuit board 3 may also be known in the art. The circuit board arrangement 1 also includes a plurality of externally accessible data acquisition channel input ports (A and B) 12, an externally accessible trigger input 13 for a scope mode operation, an externally accessible trigger level control system 14, and a data/power supply output 15. The data acquisition channel input ports 12 and the trigger input 13 can be coupled to an external electrical test circuit. Thus, the data from the external electrical test circuit can be provided to the data acquisition device 4 via the externally accessible data ports 12. The trigger level control system 14 may be coupled to the data acquisition device 4 either directly or via the digital control system 8.

Figure 3:
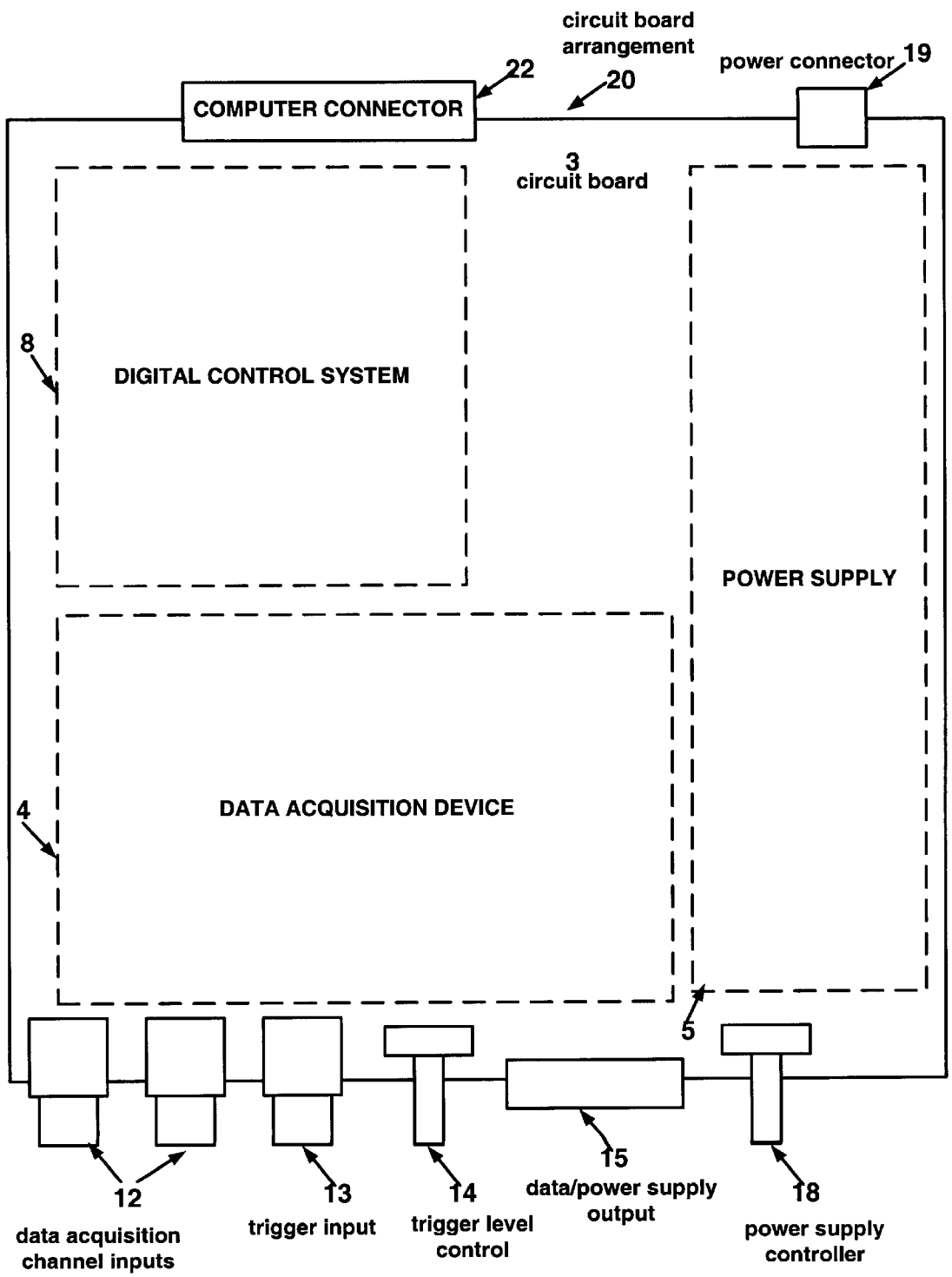
FIG. 3 shows a top view of a second embodiment of the single circuit board arrangement according to the present invention.

The power supply 5 may be, e.g., a triple output user controlled power supply 5 as shown in FIG. 3. The circuit board arrangement 1 includes an externally accessible power supply controller 18 and an externally accessible power supply input 19. The power supply controller 18 may be coupled to the power supply 5 either directly or via the digital control system 8.

FIG. 3 shows a second embodiment of a circuit board arrangement 20 according to the present invention. The circuit board arrangement 20 includes the single circuit board 3, the data acquisition device 4 and the power supply 5 thereon. As described above, the data acquisition device 4 and the power supply 5 are disposed on the single circuit board 3. In this embodiment, the single circuit board arrangement 20 is positioned in a casing of a digital computer (not shown). The single circuit board 3 includes a computer connector 22 operably coupling the single circuit board 3 and circuit elements disposed thereon to the digital computer. The computer connector 22 interfaces with the digital computer via a standard data bus slot (e.g. EISA, ISA, PCI, VXI, etc.) that is connected to the motherboard of the digital computer. The data acquisition device 4 and the power supply 5 may be disposed directly on (or attached directly to) the single circuit board 3 or upon a predetermined number of the daughter boards (e.g., preferably not exceeding three daughter boards) mounted on the single circuit board 3. If the daughter boards are used, these daughter boards should preferably not exceed an area of, e.g., approximately six square inches. The single circuit board arrangement 20 according to the second embodiment includes similar externally accessible input ports, output ports, control systems, and connection systems as described for the first embodiment above.

Figure 4:
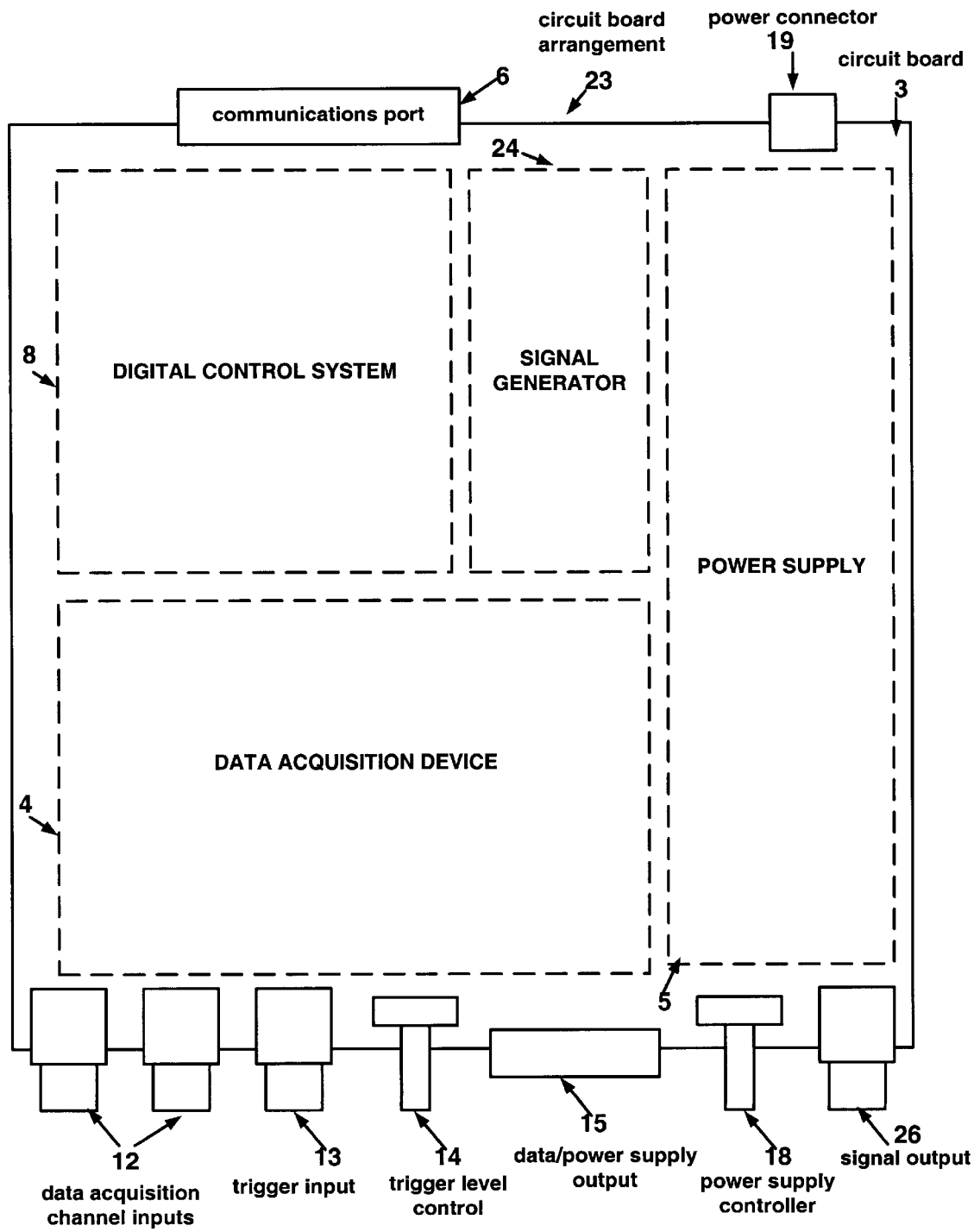
FIG. 4 shows a cross-section of a top view of a third embodiment of the single circuit board arrangement according to the present invention.
Figure 5:
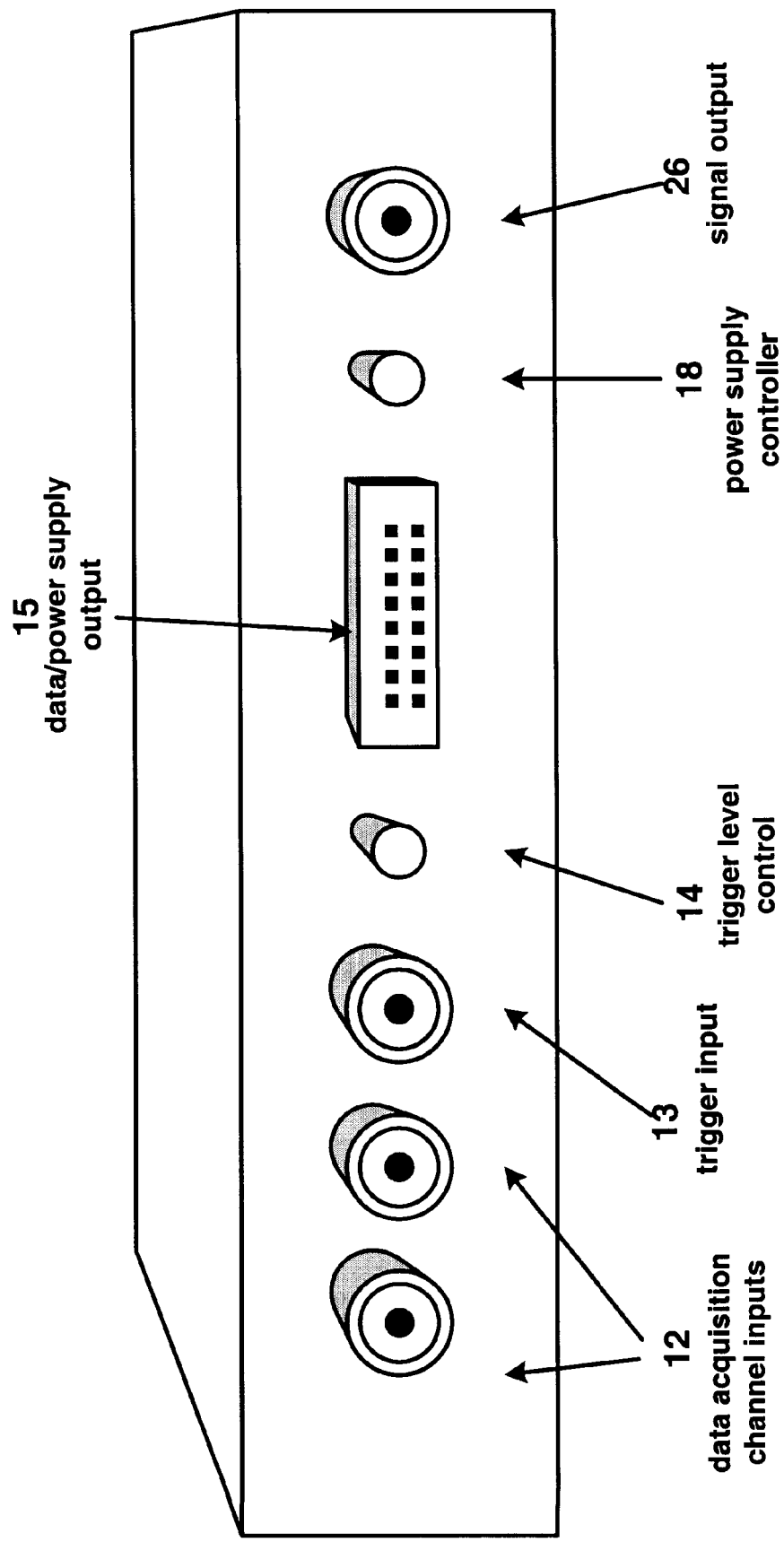
FIG. 5 shows a front view of a housing for the third embodiment of the single circuit board arrangement according to the present invention.

FIGS. 4 and 5 show a third embodiment of a circuit board arrangement 23 according to the present invention with the data acquisition device 4 and the power supply 5 arranged on the single circuit board 3. The third embodiment of a circuit board arrangement 23 includes the similar elements as described above with respect to the first embodiment shown in FIG. 1 and further disposes a signal generator 24 on the single circuit board 3 or on the daughter boards that may be situated on the single circuit board 3, and may communicate with the digital control system 8, the power supply 5 and/or the data acquisition device 4, either directly or indirectly. The data/power supply output 15 is also included, however, a signal generated output (generated by the signal generator 24) can also be provided using this output port. The signal generator 24 can be used for providing test signals (either analog or digital) to a user-built (or prefabricated) test circuit, that may be powered by, e.g., the power supply 5, in order to stimulate such test circuit to provide a test output signal. This test output signal can then be measured by, e.g., the data acquisition device 4. The signal generator 24 can include, e.g., a conventional signal generator as are known in the art. The circuit board arrangement 23 also includes an externally accessible signal output port 26, which is connected to the signal generator 24, either directly or via the digital control system 8.

Figure 6:
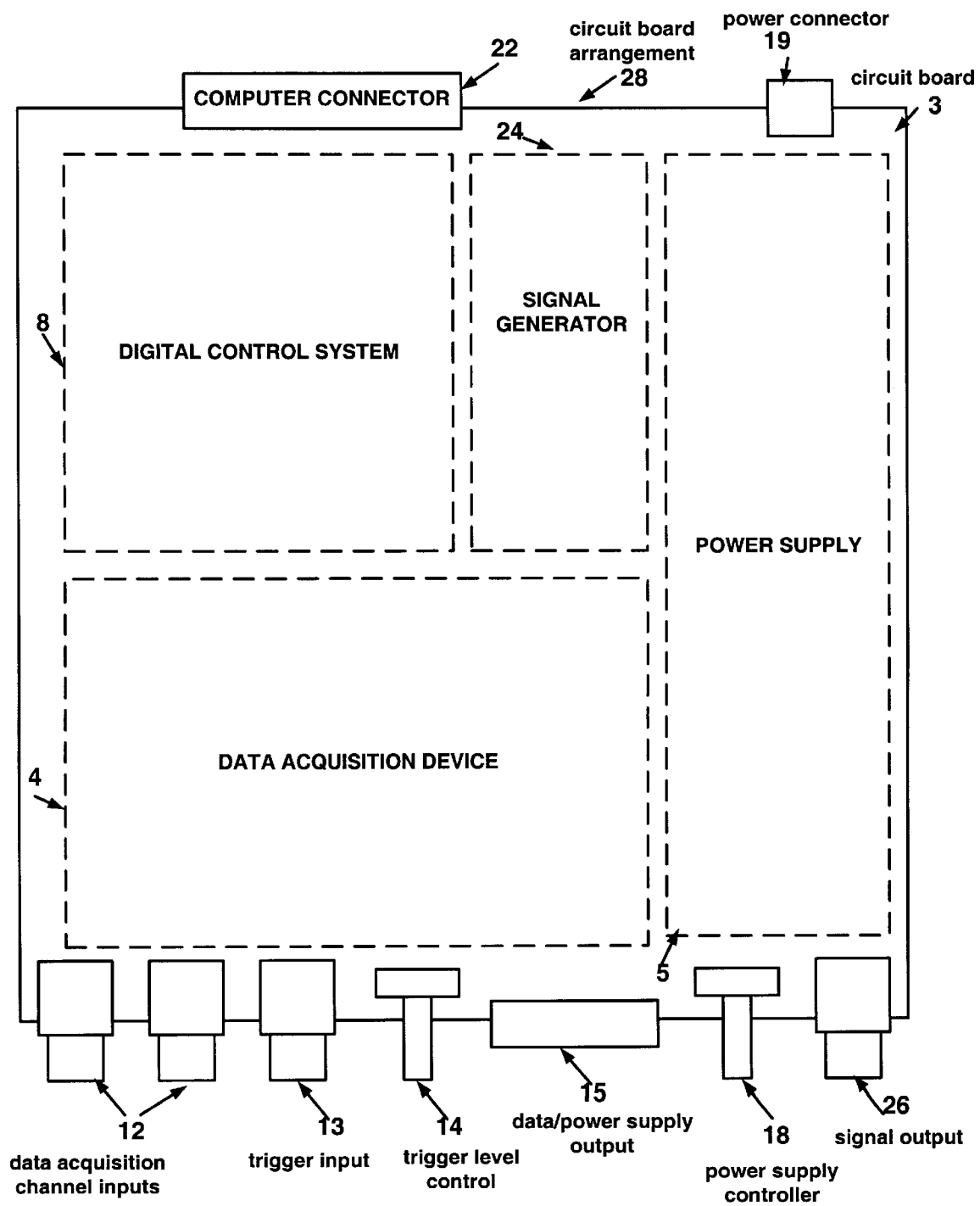
FIG. 6 shows a top view of a fourth embodiment of the single circuit board arrangement according to the present invention.

FIG. 6 shows a fourth embodiment of a single circuit board arrangement 28 according to the present invention which includes a single circuit board 3, the data acquisition device 4 and the power supply 5. The data acquisition device 4 and the power supply 5 are disposed on the single circuit board 3. The circuit board arrangement 28 includes the elements described above in the second embodiment as shown in FIG. 3 and further provides a signal generator 24 on the single circuit board 3 or on the daughter boards that can be situated on the single circuit board 3. The circuit board arrangement 28 further includes the same externally accessible signal output port 26 as described for the third embodiment above and shown in FIGS. 4 and 5.

The data acquisition device 4 can be configured by manually adjusting the externally accessible trigger level control system 14 which can be electrically coupled directly to the data acquisition device 4 or via the digital control system 8. The power supply 5 can be configured by manually adjusting the externally accessible power supply controller 18 which can be electrically coupled directly to the power supply 5 or also via the digital control system 8. The signal generator 24 can be configured by manually adjusting the externally accessible signal output port 26 which can be electrically coupled directly to the signal generator 24 or via the digital control system 8. The data acquisition device 4, the power supply 5 and/or the signal generator 24 can also be adjusted automatically by using, e.g., the digital computer. In particular, the data acquisition device 4 can be configured by a software program operating in the digital computer or by adjusting the externally accessible trigger level control system 14 to function as, e.g., a dual channel storage oscilloscope, a frequency meter, a digital multimeter, or a spectrum analyzer. The power supply 5 can also be configured by the software program operating in the digital computer and/or by adjusting the externally accessible power supply controller 18 to control the voltage and/or current output. The power supply 5 is capable of generating either a digital voltage and/or current signal or an analog voltage and/or current signal. The type of the signal (i.e., digital or analog) generated by the signal generator can be configured by the software program or manually configured. The data acquisition device 4, the power supply 5 and/or the signal generator 24 can also be controlled using, e.g., the digital control system 8. One of ordinary skill in the art would readily be able to recognize that the data acquisition device 4, the power supply 5 that ate situated on the single circuit board 3 can also be controlled using other means.

What is claimed is:

1. An electronic test facility adapted for use with a computer, comprising:

a multi-channel data acquisition means for acquiring analog and digital test signals and storing the signals for processing by a computer;

a user variable power supply providing power to an external test circuit for operating the test circuit; and a single circuit board supporting the data acquisition means and the power supply.

2. The electronic facility of claim 1, further comprising a user variable signal generator, the signal generator providing analog and digital signals for general use and disposed on the single circuit board.

3. The electronic facility of claim 1, further comprising a digital control system disposed on the single circuit board and a power supply controller coupled to the power supply directly or by the digital control system.

4. The electronic facility of claim 1, wherein the single circuit board includes at least one daughter board mounted to the single circuit board.

5. The electronic facility of claim 1, further comprising a dedicated housing for the single circuit board.

6. The electronic facility of claim 2, wherein the data acquisition means acquires signals from the test circuit, the power supply provides multiple power outputs to the test circuit, the signal generator provides analog and digital test signals to the test circuit, and a communications port connected to the data acquisition means or the digital control system provides the acquired signals from the test circuit to a digital computer.

7. An electronic test facility adapted for use with a computer, comprising:
- a multi-channel data acquisition means for acquiring analog and digital test signals and storing the signals for processing by a computer, communicating through a port of the computer and providing a storage oscilloscope;
- a user variable power supply providing power to an external test circuit for operating the test circuit;
- a user variable signal generator, the signal generator providing analog and digital signals for general use; and
- a single circuit board supporting the data acquisition means, the power supply, and the user variable signal generator.

8. The electronic facility of claim 7, further comprising a digital control system disposed on the single circuit board and a power supply controller, wherein the power supply controller is coupled to the power supply directly or by the digital control system.

9. The electronic facility of claim 7, wherein the single circuit board includes at least one daughter board mounted to the single circuit board.

10. The electronic facility of claim 7, further comprising a dedicated housing for the single circuit board.

11. The electronic facility of claim 7, further comprising an externally accessible trigger input for the storage oscilloscope mode of operation.

12. An electronic test facility coupled with a computer, comprising:
- a multi-channel data acquisition means for acquiring analog and digital test signals and storing the signals for processing by a computer, communicating through a port of the computer and providing a function;
- a user variable power supply providing power to an external test circuit for operating the test circuit;
- a user variable signal generator, the signal generator providing analog and digital signals for general use;
- software operating in the computer for configuring the data acquisition means, the power supply, and the signal generator; and
- a single circuit board supporting the data acquisition means, the power supply, and the user variable signal generator.

13. An electronic test facility, comprising:
- a multi-channel data acquisition means for acquiring analog and digital test signals and storing the signals for processing by a computer, communicating through a port of the computer and providing a function;
- a user variable power supply providing power to an external test circuit for operating the test circuit;
- a user variable signal generator, the signal generator providing analog and digital signals for general use;
- means for adjusting the data acquisition means, the power supply, or the signal generator; and
- a single circuit board supporting the data acquisition means, the power supply, and the user variable signal generator and contained in a dedicated housing.

14. The electronic test facility of claim 13, wherein the function is selected from the group consisting of a storage oscilloscope, a frequency meter, a digital multimeter, and a spectrum analyzer.

15. The electronic test facility of claim 13, wherein the function is selected from the group consisting of a storage oscilloscope, a frequency meter, a digital multimeter, and a spectrum analyzer.

16. The electronic test facility of claim 13, wherein the single circuit board includes at least one daughter board mounted to the single circuit board.

* * * * *